(12) United States Patent
Schulze et al.

(10) Patent No.: US 8,710,620 B2
(45) Date of Patent: Apr. 29, 2014

(54) METHOD OF MANUFACTURING SEMICONDUCTOR DEVICES USING ION IMPLANTATION

(75) Inventors: Hans-Joachim Schulze, Taufkirchen (DE); Johannes Laven, Taufkirchen (DE); Dieter Fuchs, Munich (DE); Werner Schustereder, Villach (AT); Roman Knoefler, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/552,014

(22) Filed: Jul. 18, 2012

(65) Prior Publication Data

US 2014/0021590 A1 Jan. 23, 2014

(51) Int. Cl.
*H01L 21/425* (2006.01)

(52) U.S. Cl.
USPC .......................................................... 257/514

(58) Field of Classification Search
CPC ............ H01L 21/26513; H01L 21/265; H01L 21/266; H01L 21/2652; H01L 21/0415; H01L 21/2253
USPC .......................................... 438/514, 518, 527
See application file for complete search history.

(56) References Cited

U.S. PATENT DOCUMENTS 6,346,464 B1 * 2/2002 Takeda et al. .................. 438/514
2007/0176115 A1 * 8/2007 Horsky et al. .................. 250/427

OTHER PUBLICATIONS

Quirk et al., "Semiconductor manufacturing technology", 2001, Prentice-Hall, Chapter 17, pp. 481-487 and 501-502.*
Onishi et al., "24mΩ cm2 689V Silicon Superjunction MOSFET", 2002, Proceedings of the 14th International Symposium on Power Semiconductor Devices and ICs, pp. 241-244, Jun. 2002.*

* cited by examiner

*Primary Examiner* — Nikolay Yushin
(74) *Attorney, Agent, or Firm* — Murphy, Bilak & Homiller, PLLC

(57) ABSTRACT

A manufacturing method provides a semiconductor device with a substrate layer and an epitaxial layer adjoining the substrate layer. The epitaxial layer includes first columns and second columns of different conductivity types. The first and second columns extend along a main crystal direction along which channeling of implanted ions occurs from a first surface into the epitaxial layer. A vertical dopant profile of one of the first and second columns includes first portions separated by second portions. In the first portions a dopant concentration varies by at most 30%. In the second portions the dopant concentration is lower than in the first portions. The ratio of a total length of the first portions to the total length of the first and second portions is at least 50%. The uniform dopant profiles improve device characteristics.

15 Claims, 14 Drawing Sheets

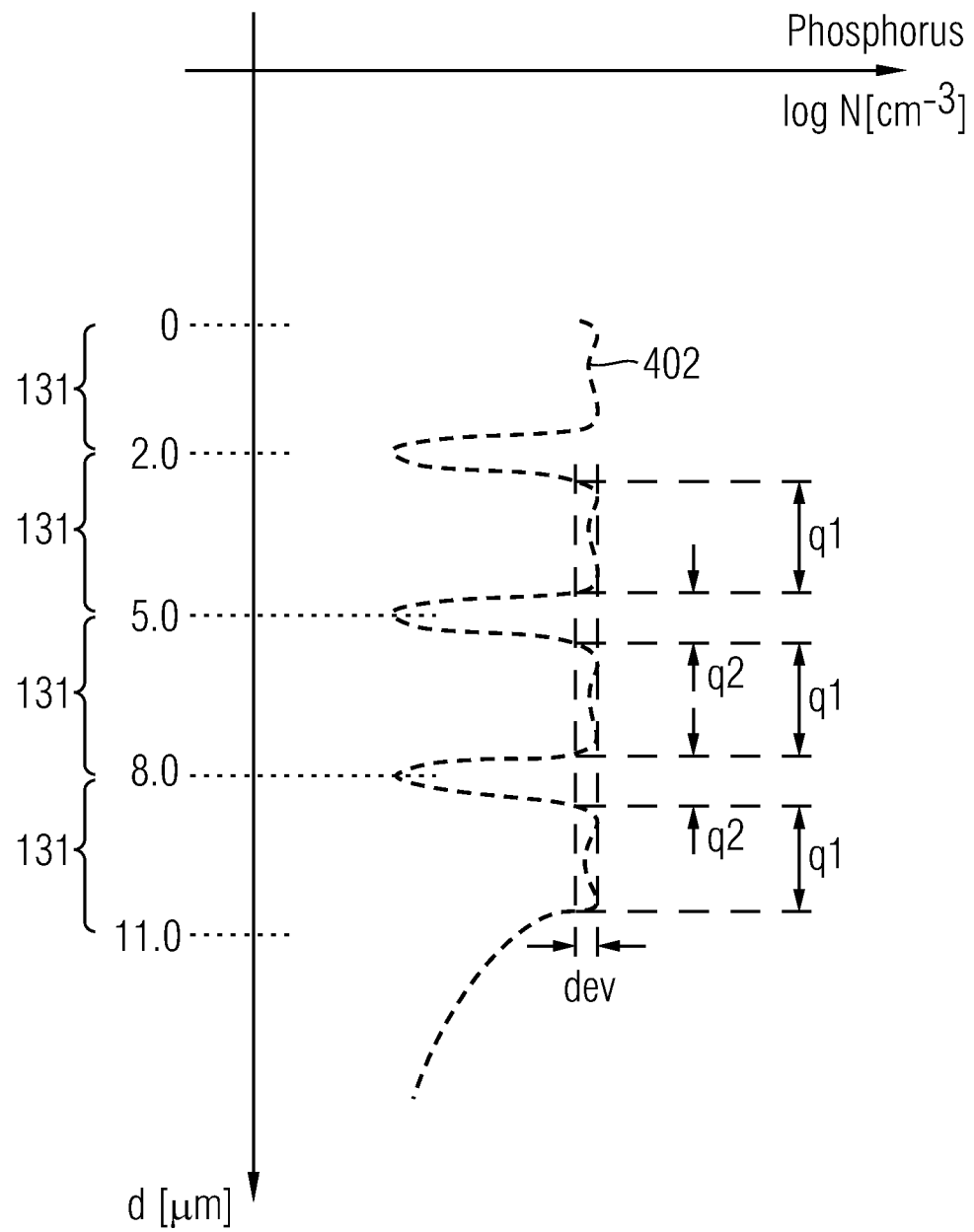

METHOD OF MANUFACTURING SEMICONDUCTOR DEVICES USING ION IMPLANTATION

BACKGROUND

Ion implantation is used to form p-doped and n-doped regions in semiconductor materials. Ionized impurity atoms are accelerated and directed at a surface of a single crystalline semiconductor substrate. The ionized atoms enter the crystal lattice, collide with the atoms of the lattice and come to rest at a depth determined by the acceleration voltage as well as the impurity and substrate materials. Ion implanting results in vertical dopant profiles showing in substance a Gaussian distribution, wherein the distance of the maximum concentration to the semiconductor surface is a function of the acceleration voltage and the standard deviation is a function of material parameters of the impurities and the substrate. It is desirable to provide more uniform dopant distributions in semiconductor devices.

SUMMARY

According to an embodiment, a method of manufacturing a super-junction semiconductor device provides growing by epitaxy a first sub-layer on a substrate layer. Impurities of a first conductivity type are implanted into first sections of an exposed first surface of the first sub-layer using an aligned low divergence ion implant process. With the aligned low divergence ion implant process a main beam direction deviates from a main crystal direction, along which channeling of implant ions occurs, by at most 1 degree. A main beam incidence angle divergence is at most ±0.5 degree. A second sub-layer is grown on the first sub-layer by epitaxy. Impurities of the first conductivity type are implanted in sections of an exposed first surface of the second sub-layer in a projection of the first sections along the main crystal direction using the aligned low divergence ion implant process.

Another embodiment refers to a super junction semiconductor device. The super junction semiconductor device includes a substrate layer of a first conductivity type and an epitaxial layer adjoining the substrate layer. The epitaxial layer includes first columns of the first conductivity type and second columns of a second conductivity type, which is the opposite of the first conductivity type. The first and second columns extend along a main crystal direction from a first surface opposite to the substrate layer into the epitaxial layer and have vertical dopant profiles perpendicular to the first surface. The vertical dopant profile of at least one of the first and second columns includes first portions separated by second portions. In the first portions a dopant concentration varies by at most 30% of a maximum value within the respective first portion. In the second portions the dopant concentration is lower than in at least one of the adjoining first portions. A ratio of a total length of the first portions to a total length of the first and second portions is at least 50%.

According to another embodiment a semiconductor device includes a semiconductor body with a source zone of a first conductivity type adjoining a first surface of the semiconductor body and a drift zone of the first conductivity type. A body zone of a second conductivity type, which is the opposite of the first conductivity type, separates the source zone from the drift zone. The body zone has a vertical dopant profile perpendicular to the first surface with a first portion and two second portions adjoining the first portion respectively. In the first portion a dopant concentration varies by at most 30% of a maximum value within the respective first portion. In the second portions the dopant concentration is lower or higher than in the first portions. A ratio of a total length of the first portions to the total length of the first and second portions is at least 50%.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 2B is a diagram showing schematically a vertical dopant profile of the super junction IGFET of FIG. 2A along line B-B.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
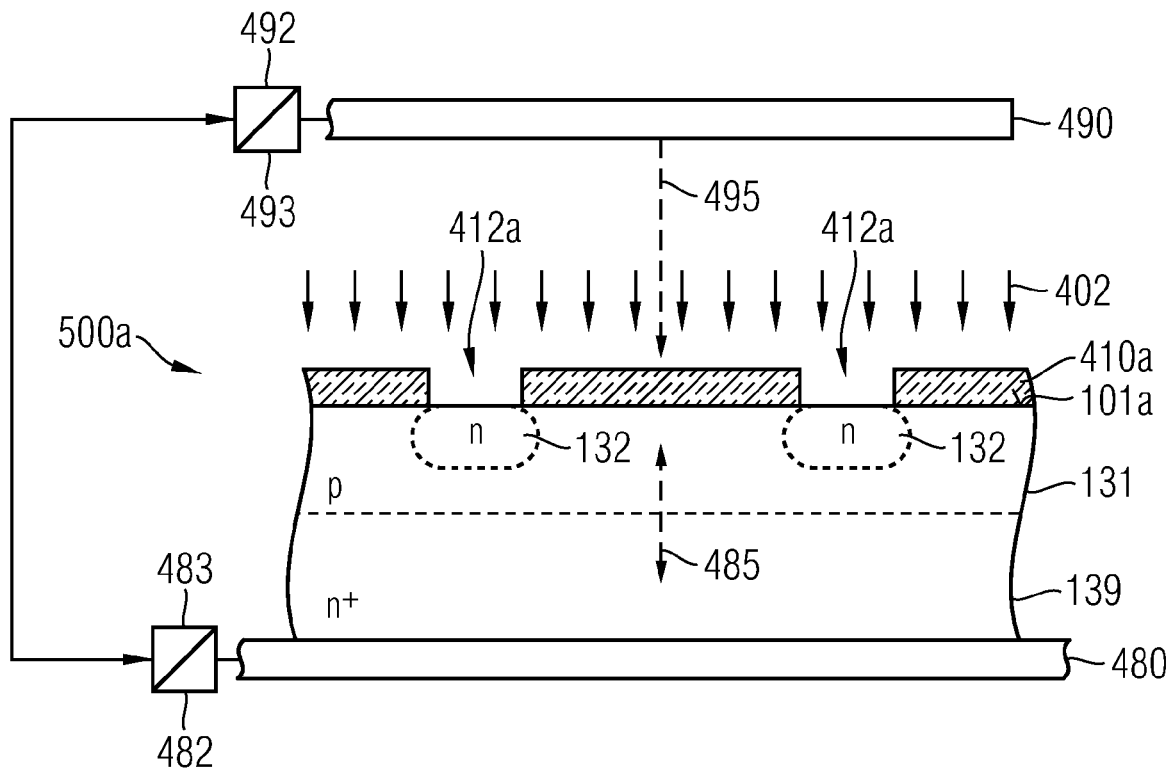
FIG. 1A illustrates a schematic cross-sectional view of a portion of a semiconductor substrate in accordance with an embodiment concerning a method of manufacturing a super junction semiconductor device on the basis of in-situ doped epitaxial layers, after implanting impurities into a first sub-layer.
Figure 1B:
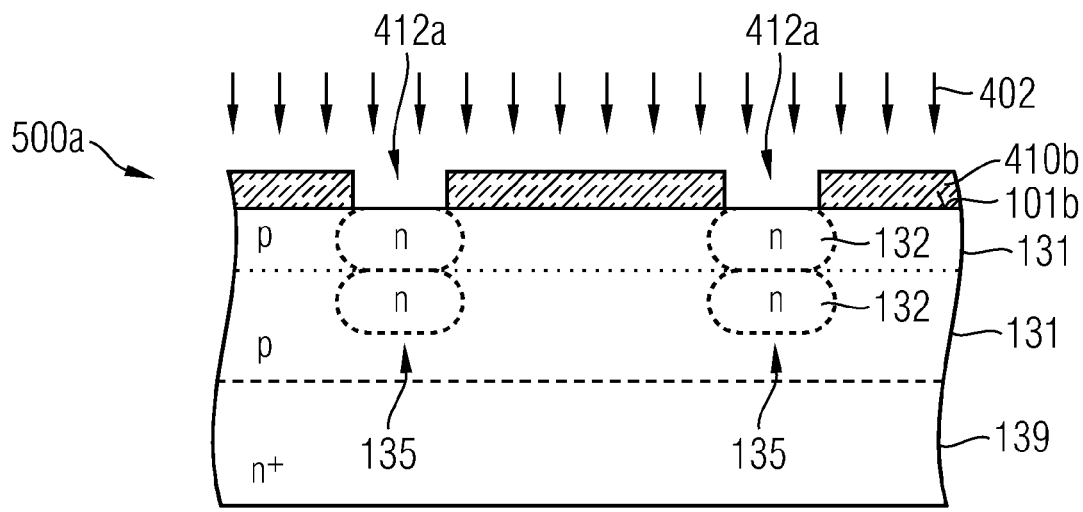
FIG. 1B is a schematic cross-sectional view of the semiconductor substrate portion of FIG. 1A after implanting impurities into a second sub-layer.

FIGS. 1A and 1B refer to a portion of a semiconductor substrate 500a for the manufacturing of a plurality of identical semiconductor devices. The semiconductor substrate 500a includes a substrate layer 139 formed from a single crystalline semiconductor material, for example silicon Si, silicon carbide SiC, germanium Ge, silicon germanium SiGe, gallium nitride GaN or gallium arsenide GaAs. According to an embodiment, the substrate layer 139 may be a single crystalline silicon or a silicon carbide wafer. The substrate layer 139 may be strongly n-doped or strongly p-doped.

A first sub-layer 131 is grown by epitaxy on a surface of the substrate layer 139. With the substrate layer 139 being effective as a seed, the first sub-layer 131 is grown in registry with the substrate layer 139, wherein a crystal lattice of the first sub-layer 131 logs into the crystallographic orientations of the substrate layer 139. The first sub-layer 131 may be in-situ doped and may have the same conductivity type as the substrate layer 139 or the opposite conductivity type.

The substrate layer 139 and the first sub-layer 131 have crystal directions suitable for channeling implant particles. In certain crystal directions in single crystalline materials like the first sub-layer 131, open spaces exist that extend straight into the crystal. The open spaces form channels through which the ionized atoms travel without significant scattering. The channels steer the ionized atoms by glancing collisions such that the ionized atoms arrive at larger distances to the entrance surface than when implanted tilted to the channels. The vertical distribution of the implanted ions along the channel direction shows a stretched range of comparatively low concentration variations for boron and phosphorus implants.

According to an embodiment the substrate layer 139 has a diamond cubic crystal lattice like silicon Si. In the case of a diamond cubic crystal lattice, the substrate layer 139 may be provided such that an exposed first surface 101a of the first sub-layer 131 coincides with a {100} crystal face. Then a <110> crystal direction, which is one of several directions along which channeling occurs, runs perpendicular to the exposed first surface 101a and represents a direction denominated as main crystal direction 485 in the following.

A first mask layer is deposited on the exposed first surface 101a of the first sub-layer 131 opposite to the substrate layer 139. The first and further mask layers may be provided from materials absorbing high energy ions at low layer thickness and showing a high etch selectivity against the single crystalline material of the sub-layers 131. For example, the first and further mask layers may be provided from silicon oxide, silicon nitride, carbon, a photoresist material, polycrystalline silicon or amorphous silicon, by way of example.

A photolithographic process patterns the first mask layer to form a first implant mask 410a with openings 412a exposing a plurality of first sections of the first sub-layer 131. Each die portion of the semiconductor substrate 500a assigned to one single semiconductor device includes a plurality of first sections, which may be grouped into arrays and which may be evenly spaced within each array.

The openings 412a may be stripes extending in a direction perpendicular to the cross-sectional plane. According to other embodiments, the openings 412a may be rotational symmetric. For example, the openings 412a may be circles, ellipses or squares or hexagons with rounded corners.

The semiconductor substrate 500a may rest on or may be fixed at a substrate carrier 480. A first inclination sensor unit 482 may sense an inclination of the substrate carrier 480 or the semiconductor substrate 500a with regard to a reference plane or with regard to a main beam direction 495. Alternatively or in addition, a second inclination sensor unit 492 may sense an inclination of the main beam direction 495 of an ion beam generated by an ion beam source 490 with regard to a reference axis or with regard to the surface of the semiconductor substrate 500a. A first actuator unit 483 may adjust the inclination of the substrate carrier 480 or the semiconductor substrate 500a in response to signals received from the first and/or second inclination sensor units 482, 483. Alternatively or in addition, a second actuator unit 493 may control the ion beam source 490 to adjust the inclination of the main beam direction 495 in response to signals received from the first and/or second inclination sensor units 482, 483. The divergence of the ion beam with respect to the main beam direction 495 may be monitored and re-adjusted by the ion beam source 490 such that the beam divergence does not exceed ±0.2 degree. A total main beam incidence angle divergence considering the beam divergence, a bowing of the semiconductor substrate 500a resulting from mechanical stress, a tilt of the surface of the semiconductor substrate 500a from the crystal plane (wafer cut) and other mechanisms is at most ±0.5 degree, for example at most ±0.3 degree. According to an embodiment, the main beam incidence angle divergence is at most ±0.15 degree. The ion beam source 490 is adapted to generate an aligned low divergence implant process.

The conditions concerning the main beam direction and the main beam incidence angle divergence are fulfilled for at least 80% of the surface of the semiconductor substrate 500a. According to an embodiment the conditions concerning the main beam direction and the main beam incidence angle divergence are fulfilled for at least 90% of the surface of the semiconductor substrate 500a.

Using at least one of the inclination sensor units 482, 492 and at least one of the actuator units 483, 493, the semiconductor substrate 500a is aligned to the main beam direction 495 such that the main beam direction 495 at least approximately coincides with the main crystal direction 485, at a deviation between the main beam direction 495 and the main crystal direction 485 of at most ±1.0 degree, e.g. at most ±0.8 degree, ±0.5 degree, ±0.3 degree or ±0.15 degree. The smaller the deviation the more pronounced is the channeling effect. According to an embodiment, the deviation between the main crystal direction 485 selected for channeling and the main beam direction 495 is 0 degree.

Impurities 402 of a conductivity type which is the opposite of the conductivity type of the in-situ doped first sub-layer 131 are ion implanted through the openings 412a using the aligned low divergence ion implant process, wherein the divergence of the ion beam is monitored and re-adjusted to not exceed a main beam incidence angle divergence of at most ±0.5 degrees, for example ±0.3 degree or at most ±0.15 degree.

During implanting the impurities 402 of the first conductivity type, an angle between the exposed first surface 101a of the first sub-layer 131 and the main beam direction 495 is sensed and re-adjusted such that the angle between the main beam direction 495 and the main crystal direction 485 has a predefined value between 0 and ±1 degree at a main beam incidence angle divergence of at most ±0.5 degree. According to an embodiment the predefined value for the angle between the main beam direction 495 and the main crystal direction 485 is 0 degree and the main beam direction 495 coincides with the main crystal direction 485 for at least 80% of the surface of the semiconductor substrate 500a. According to an embodiment the condition concerning the angle between the main beam direction and the main crystal direction is fulfilled for at least 90% of the surface of the semiconductor substrate 500a.

FIG. 1A shows the in-situ doped first sub-layer 131 grown by epitaxy on the highly doped substrate layer 139, which in the illustrated embodiment has the same conductivity type. Through openings 412a in the first implant mask 410a impurities 402 of a conductivity type, which is the opposite of the conductivity type in the in situ doped first sub-layer 131, are ion implanted into the first sub-layer 131 to form first implant zones 132 of a first type in first sections of the first sub-layer 131. Other than implant zones resulting from conventional ion implants with main beam directions tilted to the normal of a substrate surface by e.g. 7 degree and producing approximately Gaussian distributions with pronounced peak maxima, the vertical impurity profiles of the implant zones 132 show plateaus, i.e. stretched portions of comparatively low concentration deviations of less than 50% before annealing.

The first implant mask 410a is removed and a second sub-layer 131 is grown by epitaxy on the exposed first surface 101a of the first sub-layer 131. A second mask layer is deposited and patterned by photolithographic techniques to form a second implant mask 410b with openings 412a in the vertical projection of the implant zones 132. Impurities 402 of the conductivity type opposite to the in-situ doped sub-layers 131 are implanted using the above described aligned low divergence ion implant process to form further implant zones 132 of the first type.

FIG. 1B shows the second implant mask 410b above the second sub-layer 131 as well as the implant zones 132 resulting from the aligned implant of the impurities 402 of the first type into the second sub-layer 131. Each implant zone 132 in the second sub-layer 131 is connected with the corresponding implant zone 132 in the first sub-layer 131. Corresponding implant zones 132 in adjoining sub-layers 131 are arranged along the main crystal direction 485.

The sequence of removing an implant mask, growing a sub-layer by epitaxy, providing a further implant mask and implanting impurities of the first type in sections of a first surfaces of the further sub-layer in a vertical projection of the implant zones 132 may be further repeated once, twice or three or more times. After implanting the last implant zones, anneals may be performed to heal implant damages and to smooth the dopant profiles in the vertical and lateral directions.

In the illustrated embodiment, the first conductivity type is n-type and the conductivity type of the in-situ doped sub-layers 131 is p-type. Other embodiments may provide in-situ doped sub-layers of p-type and n-type implant zones 132. Further embodiments related to IGBTs may provide epitaxial sub-layers 131 of a conductivity type opposite to that of the substrate layer 139 and implant zones of the conductivity type of the substrate layer 139.

Along a direction perpendicular to the first surfaces 101a, 101b, each implant zone 132 has a vertical dopant profile with a plateau extending over several micrometers. According to an embodiment the plateaus have a length between 2.0 and 4.5 micrometer. Implant zones 132 aligned along the main crystal direction 485 form columns 135 with approximately uniform vertical dopant profiles at a reduced number of epitaxy and implant steps compared to conventional implants tilted to the normal of the first surfaces by more than 3 degree. The number of epitaxial sub-layers, implantation steps and masking steps can be significantly reduced.

A lower thermal budget is required for a diffusion process smoothening the implanted profiles. Therefore, a vertical pn junction between the columns and the in-situ doped portions of the sub-layers 131 shows only low lateral undulation. Within the columns 135 the dopant distribution is uniform both in the vertical direction and a lateral direction parallel to the surfaces 101a, 101b. With reference to conventional approaches, the same degree of concentration uniformity can be obtained at a significantly reduced temperature budget.

Shadowing effects of the implant masks occurring for tilted implants can be avoided allowing more accurate and better-defined implant boundaries.

Figure 2A:
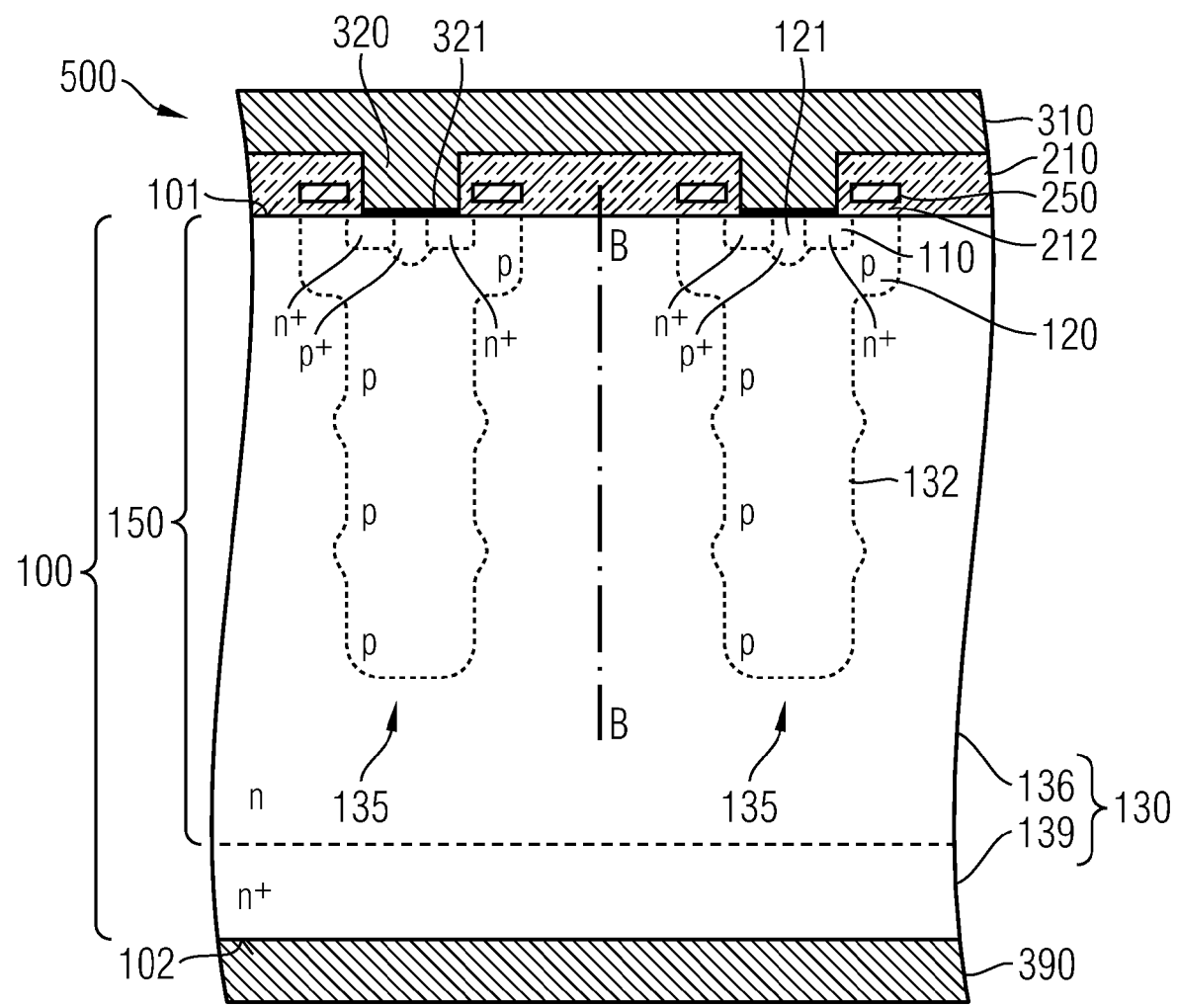
FIG. 2A is a schematic cross-sectional view of a portion of a super junction IGFET (insulated gate field effect transistor) according to an embodiment.

FIG. 2A refers to a semiconductor device 500 of the super junction type. According to the illustrated embodiment, the semiconductor device 500 is an n-FET and includes a semiconductor body 100 with a substrate layer 139 and an epitaxial layer 150. The epitaxial layer 150 includes source zones 110 and a drift zone 136, both of the conductivity type of the substrate layer 139. The source zones 110 adjoin a first surface 101 of the epitaxial layer 150 opposing the substrate layer 139. Body zones 120 of a conductivity type, which is opposite to the conductivity type of the substrate layer 139, separate the source zones 110 from the drift zone 136. Highly doped body contact zones 121 of the conductivity type of the body zones 120 adjoin the first surface 101 and provide a low ohmic connection from the first surface 101 to the body zones 120. The drift zone 136 and the substrate layer 139 form a drain zone 130.

Gate electrodes 250 formed from one or more conductive materials, for example highly doped polycrystalline silicon, metals, metal compounds or metal alloys are disposed outside the semiconductor body 100 at a distance to the first surface 101. Gate dielectrics 212 separate the gate electrodes 250 from the semiconductor body 100 and the body zones 120. According to other embodiments, the gate electrodes 250 may be provided in trenches extending from the first surface 101 into the epitaxial layer 150.

In an off state of the semiconductor device 500, the pn-junctions of the body zones 120 inhibit a current flow between the source zones 110 and the drain zone 130. In an on state, a positive potential applied to the gate electrodes 250 controls the charge carrier distribution in a channel portion of the body zones 120 along the gate dielectrics 212 to form a conductive channel of minority charge carriers between the source zones 110 and the drain zone 130.

A dielectric structure 210 is formed in direct contact with the first surface 101. The dielectric structure 210 may include one or more sub-layers, for example an adhesion layer, a buffer layer and/or a diffusion barrier layer. According to an embodiment, the dielectric structure 210 includes a thermally grown semiconductor oxide layer formed contemporaneously with the gate dielectric 212. The dielectric structure 210 may include a diffusion barrier layer, for example a silicon nitride or silicon oxynitride layer. A thin silicon oxide layer provided from deposited oxide, for example using TEOS (Tetraethylorthosilane) as precursor material, or a silicate glass, for example undoped silicate glass, may form an adhesive or buffer layer. A main dielectric layer may be provided from BSG (boron silicate glass), PSG (phosphorus silicate glass) or BPSG (boron phosphorus silicate glass). Other embodiments may provide less or more sub-layers.

The semiconductor device 500 further includes a first metal layer 310 which the dielectric structure 210 electrically separates from the gate electrodes 250 and the drain zone 130. A second metal layer 390 directly adjoins a second surface 102 of the semiconductor body 100 opposite to the first surface 101. In the illustrated embodiment, the first metal layer 310 provides a source electrode and the second metal layer 390 a drain electrode of the semiconductor device 500.

The first and second metal layers 310, 390 may consist of or contain, as main constituent(s), aluminum Al, copper Cu or alloys of aluminum or copper, for example AlSi, AlCu, or AlSiCu. According to other embodiments, the first and/or second metal layers 310, 390 may contain, as main constituents, nickel Ni, titanium Ti, silver Ag, gold Au, platinum Pt and/or palladium Pd. For example, at least one of the metal layers 310, 390 may include two or more sub-layers, each sub-layer containing one or more of Ni, Ti, Ag, Au, Pt, and Pd as main constituent(s) and/or alloys therefrom.

Contact plugs 320 electrically connect the first metal layer 310 with the source zones 110 and the body contact zones 121. The contact plugs 320 may include metal silicides 321, for example a titanium silicide TiSi, tantalum silicide TaSi or tungsten silicide WSi, by way of example. The metal silicide 321 is formed along the interface between the contact plugs 320 and the semiconductor body 100. According to the illustrated embodiment, the contact plugs 320 rest on the first surface 101. Other embodiments may provide contact trenches extending from the first surface 101 into the semiconductor body 100, wherein the metal silicides 321 line the bottom and the sidewalls of the contact trenches.

Columns 135 of the conductivity type of the body zones 120 extend in a vertical direction perpendicular to the first and second surfaces 101, 102 below the body zones 120. The columns 135 are structurally and electrically connected with the body zones 120. Each column 135 includes one or more implant zones 132 adjoining to each other in the vertical direction. Each of the implant zones 132 of a column 135 has a vertical dopant profile showing a low deviation of at most 30% over at least 50% of the respective total vertical extension of the implant zone 132. According to an embodiment the deviation within each implant zone 132 is at most 15% for more than 50% of the vertical extension of the concerned implant zone 132, for example for at least 65% or at least 80%.

In the case of the illustrated n-FET, a high impurity concentration in the drift zone 136 results in a low on-state resistance. On the other hand, when a reverse voltage is applied, depletion zones extend between the p-doped columns 135 and the n-doped drift zone 136 in the lateral direction such that a high reverse breakdown voltage can be achieved despite the high impurity concentration in the n-doped drift zone 136.

FIG. 2B shows the vertical dopant profile 260 along line B-B of FIG. 2A at a logarithmic scale. In a portion corresponding to the body contact zones 121, the dopant concentration may have a maximum value at or close to the first surface 101. Within the sections corresponding to the body zone 120 and the implant zones 132 the relative dopant maximum values may be approximately equal. According to other embodiments, the dopant maximum values of the implant zones 132 may differ from each other.

The vertical dopant profile of the first columns 135 includes first portions q1 and second portions q2. Each first portion is assigned to an epitaxial sub-layer 131 and at least one implant process into the respective sub-layer 131. Each second portion q2 is assigned to an interface between adjoining sub-layers 131 and separates neighboring first portions q1. Within each first portion q1 a dopant concentration varies by an amount (dev) of at most 30% of an absolute maximum value within the respective first portion q1. In the second portions q2, the dopant concentration is lower than in at least one of the adjoining first portions q1. According to the illustrated embodiment, the dopant concentration in the second portions q2 is lower than in both adjoining first portions q1. A ratio of a total length of the first portions q1 to the total length of the first and second portions q1, q2 is at least 50%. In other words, along at least 50% of the vertical extension of the first columns 135 the dopant concentration varies by at most 30%. According to another embodiment the deviation within each sub-layer 131 is at most 15% for more than 50% of the vertical extension of the concerned sub-layer 131, for example for at least 65% or at least 80%.

The more uniform dopant profiles in the lateral and vertical directions result in a more homogenous electric field and a higher reverse breakdown voltage.

While the illustrated embodiment refers to an n-FET of the enhancement type, other embodiments may provide depletion type n-FETs, enhancement p-FETs or depletion p-FETs.

Figure 2C:
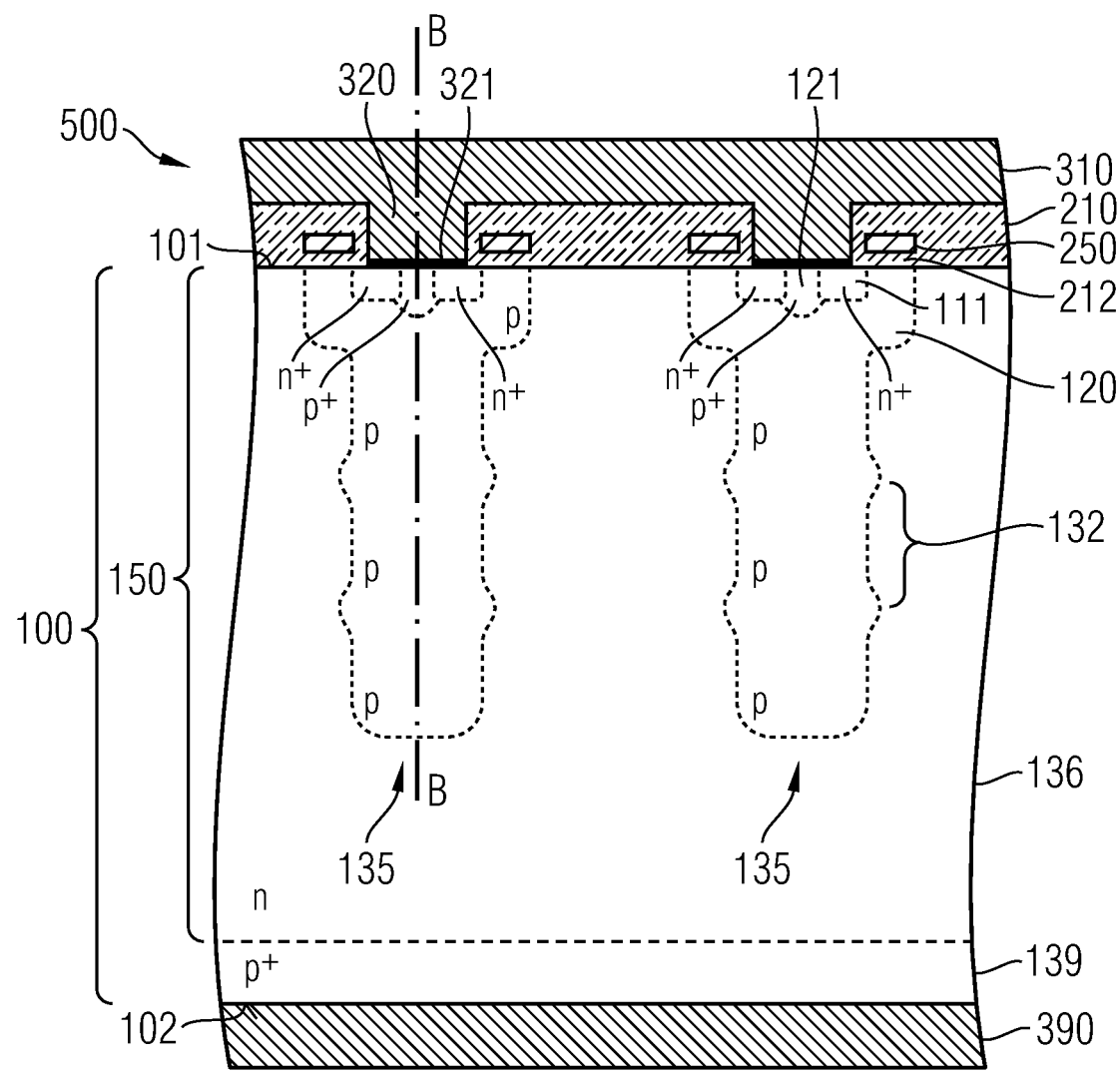
FIG. 2C is a schematic cross-sectional view of a portion of a super junction IGBT (insulated gate bipolar transistor) according to another embodiment.

FIG. 2C refers to a semiconductor device 500 forming a super junction IGBT. The substrate layer 139 is of the conductivity type of the body zones 120 and may be effective as a collector zone. Emitter zones 111 of the conductivity type of the drift zones 136 directly adjoin the first surface 101. The first metal layer 310 provides an emitter electrode and the second metal layer 390 a collector electrode. The drift zone 136, the body zones 120 and the columns 135 are formed analogously to the drift zone 136, the body zones 120 and the columns 135 of FIGS. 2A and 2B.

Figure 2D:
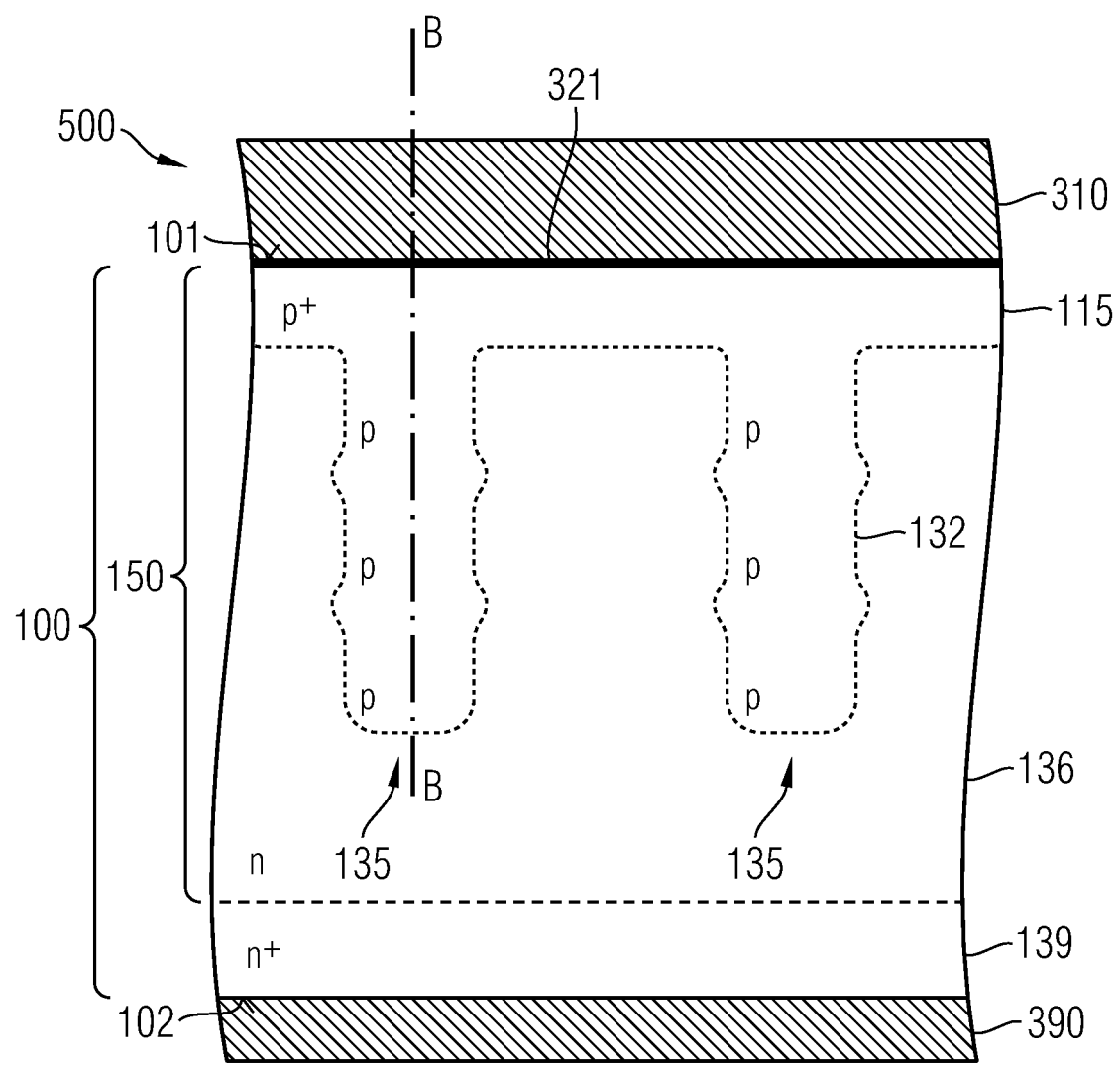
FIG. 2D is a schematic cross-sectional view of a portion of a super junction diode according to a further embodiment.

FIG. 2D refers to a semiconductor device 500 forming a super junction semiconductor diode. Instead of source and body zones 110, 120, the semiconductor device 500 includes an anode layer 115. The first metal layer 310 provides an anode electrode and the second metal layer 390 a cathode electrode.

FIGS. 3A to 3D relate to the manufacturing of a super junction semiconductor device providing initially intrinsic epitaxial sub-layers. An intrinsic sub-layer 131 is grown by epitaxy on a substrate layer 139 being effective as a seed. The crystal lattice of the first epitaxial sub-layer 131 inherits the crystal orientation of the substrate layer 139. A first implant mask layer is deposited onto an exposed first surface 101a of the first sub-layer 131 and is patterned by photolithographic techniques to form a first implant mask 410a for the first sub-layer 131 with openings 412a exposing first sections of the first sub-layer 131. With the above-described aligned low divergence ion implant process impurities 402 of a first type are implanted through the openings 412a into the first sub-layer 131, wherein the main beam direction 495 is adjusted to coincide with the main crystal direction 485 along which channeling of implanted ions occurs. The implant beam and main crystal directions 495, 485 coincide when the angle between them is at most ±0.5 degree, e.g. at most ±0.15 degree over at least 80%, for example at least 90%, of a surface of the first sub-layer 131.

Figure 3A:
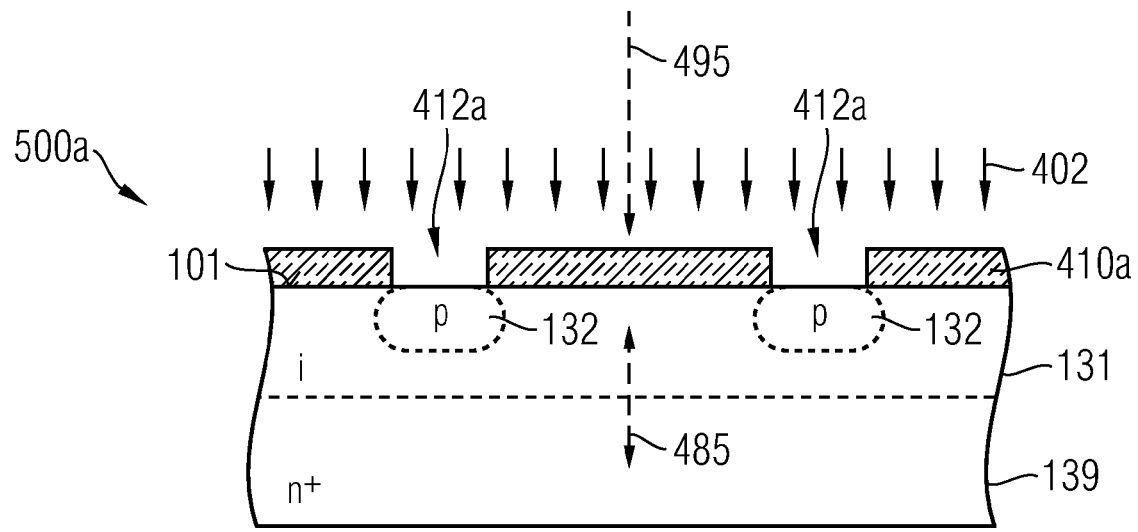
FIG. 3A is a schematic cross-sectional view of a portion of a semiconductor substrate in accordance with an embodiment concerning a method of manufacturing a super junction semiconductor device providing intrinsic epitaxial sub-layers, after implanting impurities of a first type into a first sub-layer.
Figure 3B:
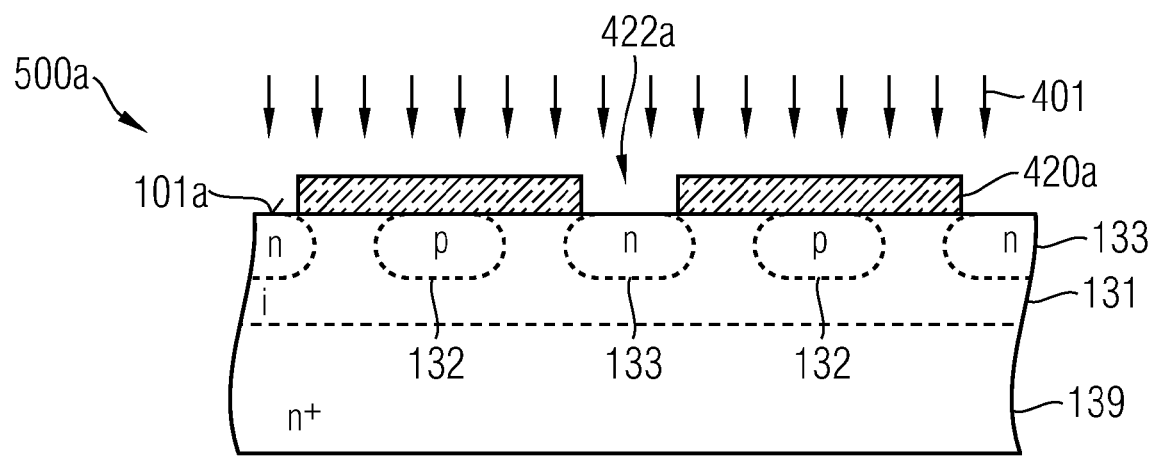
FIG. 3B is a schematic cross-sectional view of the semiconductor substrate of FIG. 3A after implanting impurities of a second type into the first sub-layer.

FIG. 3A shows first implant zones 132 of a first conductivity type formed in first sections exposed by the openings 412a of the first implant mask 410a disposed on the intrinsic first epitaxial sub-layer 131, which is formed on the substrate layer 139.

The first implant mask 410a is removed, a second implant mask layer is deposited and patterned by photolithographic techniques to form a second implant mask 420a for the first sub-layer 131 with openings 422a above second sections of the first sub-layer 131. Impurities 401 of a second type are implanted through the openings 422a to form second implant zones 133 of a second conductivity type, which is the opposite of the first conductivity type, in the second sections of the first sub-layer 131, wherein an angle between the implant beam and main crystal directions 495, 485 is at most ±0.5 degree, e.g. at most ±0.3 degree or at most ±0.15 degree for at least 80%, for example at least 90%, of a surface of the first sub-layer 131.

The second implant zones 133 are formed between the first implant zones 132 and may be equally spaced to both neighboring first implant zones 132, respectively. The first and second implant zones 132, 133 may form stripes extending in a direction perpendicular to the cross-sectional plane. According to other embodiments, either the first or the second implant zones 132, 133 show a rotational symmetry. For example, a cross-section parallel to the first surface 101a may be a circle, an ellipse or a square or a hexagon with rounded corners. One type of implant zones 132, 133 may form a mesh embedding the other type of implant zones 133, 132. Both the first and second implant zones 132, 133 are formed using the channeling effect.

The second implant mask 420a is removed and a second intrinsic sub-layer 131 is grown by epitaxy on the exposed first surface 101a of the first sub-layer 131. A further implant mask layer is deposited on the exposed first surface 101b of the second sub-layer 131 and patterned by lithographic techniques to form a first implant mask 410b for the second sub-layer 131 with openings 412b in a vertical projection of the first implant zones 132 in the first sub-layer 131. Impurities 402 of the first type are implanted through the openings 412b into the second sub-layer 131 using the above-described aligned low divergence ion implant process.

Figure 3C:
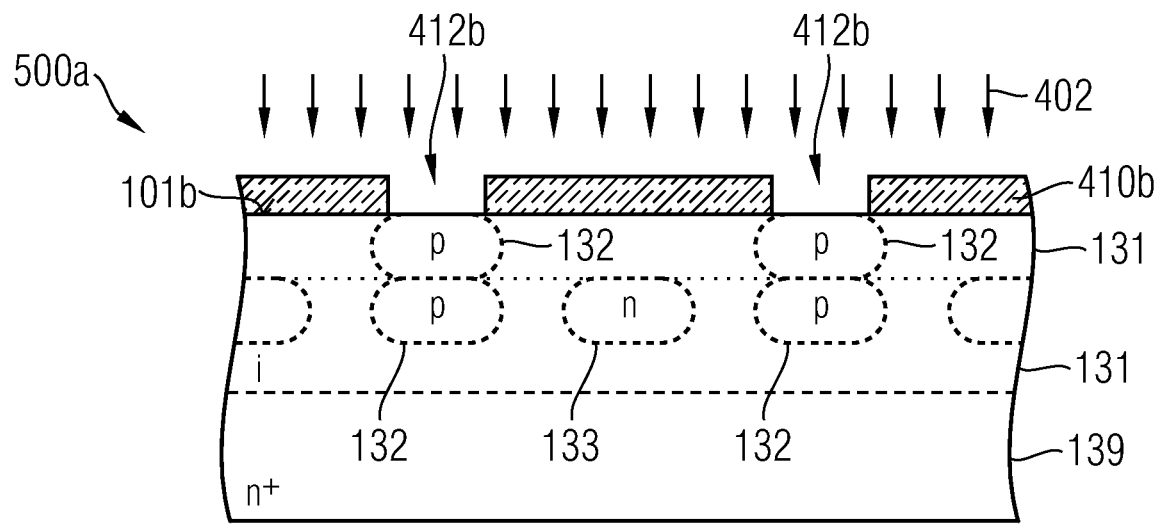
FIG. 3C is a schematic cross-sectional view of the semiconductor substrate of FIG. 3B after implanting impurities of the first type into a second sub-layer.

FIG. 3C shows the first implant zones 132 formed in the second sub-layer 131 above and in a vertical projection of the first implant zones 132 in the first sub-layer 131. The first implant mask 410b for the second sub-layer 131 is removed and replaced by a second implant mask 420b for the second sub-layer 131 with openings 422b in the vertical projection of the second implant zones 133 in the first sub-layer 131.

Figure 3D:
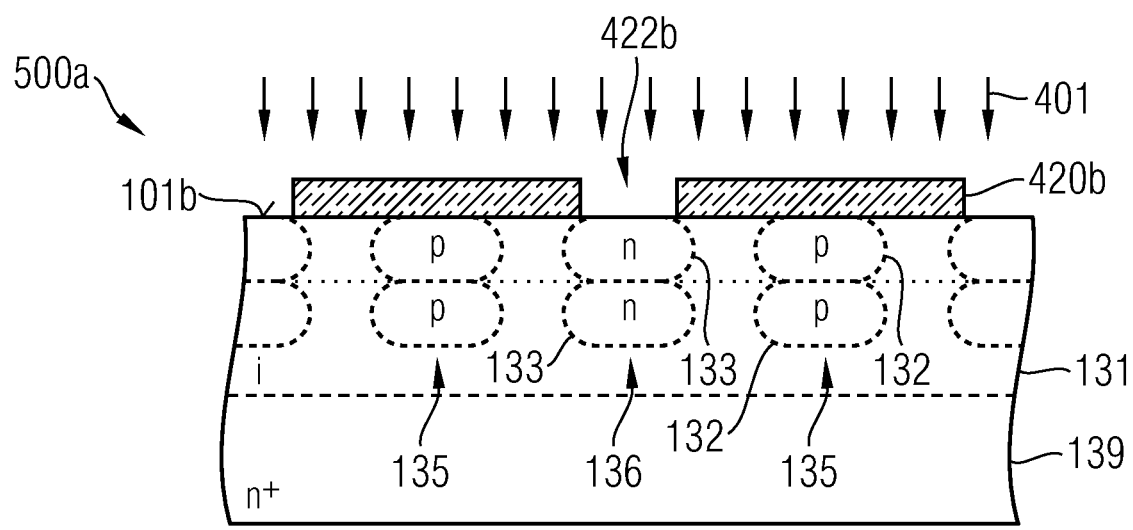
FIG. 3D is a schematic cross-sectional view of the semiconductor substrate of FIG. 3C after implanting impurities of the second type into the second sub-layer.

According to FIG. 3D the process results in first columns 135 formed by structurally and electrically connected first implant zones 132 of a first conductivity type and second columns 136 formed by structurally and electrically connected second implant zones 133 of a second conductivity type, which is the opposite of the first conductivity type.

The sequence of removing an implant mask, growing an intrinsic epitaxial sub-layer 131 and implanting impurities 401, 402 to form implant zones 132, 133 of the first and the second conductivity type using different masks may be repeated once, twice or three or more times. After the last implant, the semiconductor substrate 500a is tempered to heal implant damages and to diffuse impurities out from the first and second implant zones 132, 133 along the vertical and lateral directions.

In the lateral direction, the impurities may flood the initially intrinsic portions of the sub-layers 131 between the first and second columns 132, 133 completely such that vertical pn-junctions are formed between neighboring first and second columns 132, 133.

Figure 4A:
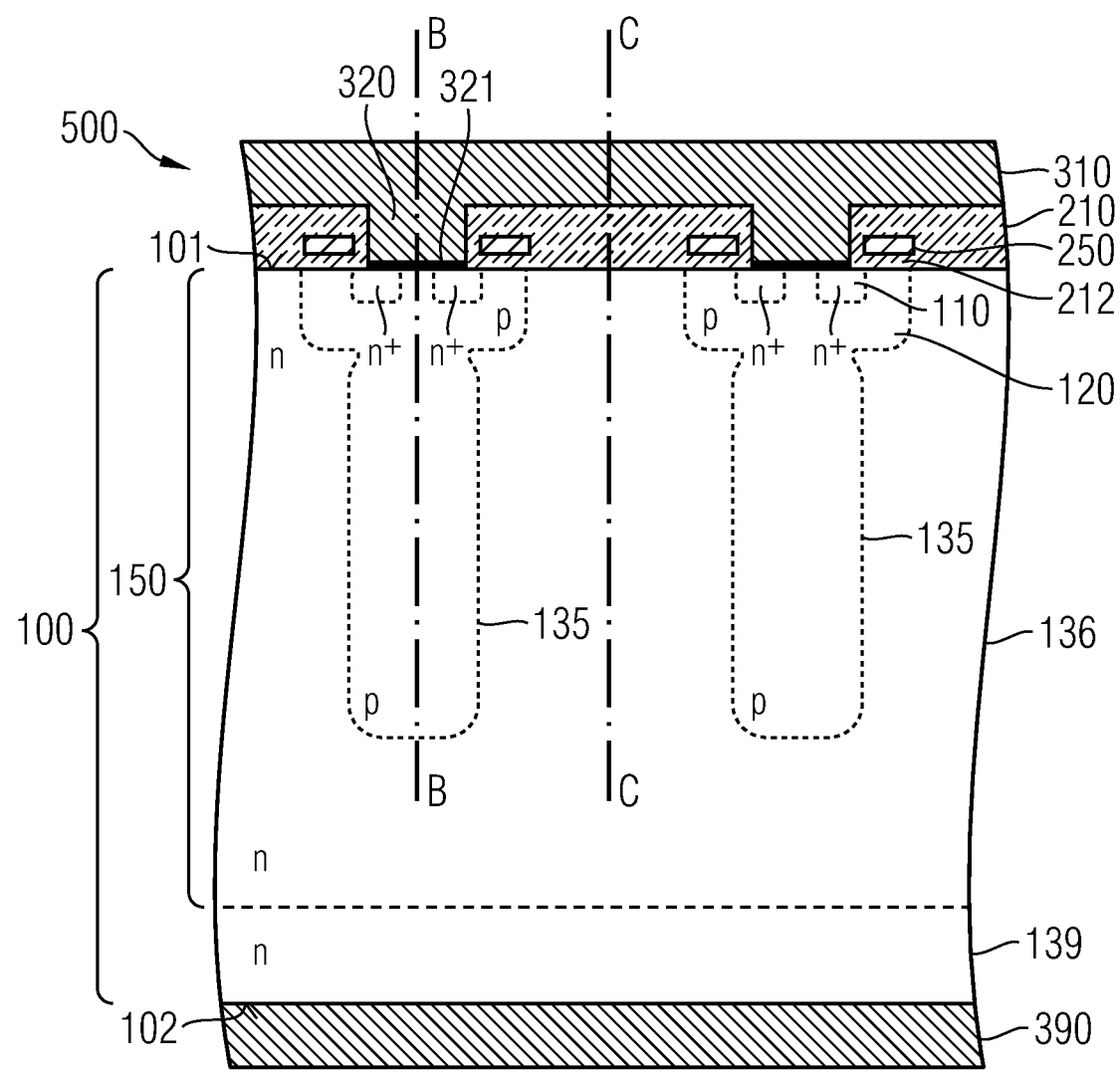
FIG. 4A is a schematic cross-sectional view of a super junction IGFET based on an initially intrinsic epitaxial sub-layers.

FIG. 4A shows a semiconductor device 500 manufactured according to the process described in connection with FIGS. 3A to 3D. According to the illustrated embodiment, the semiconductor device 500 is an n-FET and widely corresponds to the semiconductor device 500 of FIG. 2A. Since the dopant concentrations for both conductivity types are adjusted by implants, the vertical and lateral doping profiles of both types of impurities can be adjusted more precisely such that undulations of the dopant profiles can be further reduced. The electrical field distribution is more homogenous and at a predetermined thickness of the semiconductor body 100 a higher breakdown voltage can be achieved. The more homogeneous distribution in the n-type columns 136 avoids extended regions with low dopant concentrations such that the on-state resistance Rdson is significantly decreased compared to equivalent conventional devices.

According to other embodiments, the process as described in FIGS. 3A to 3D is used to manufacture super junction diodes or super junction IGBTs.

Figure 4B:
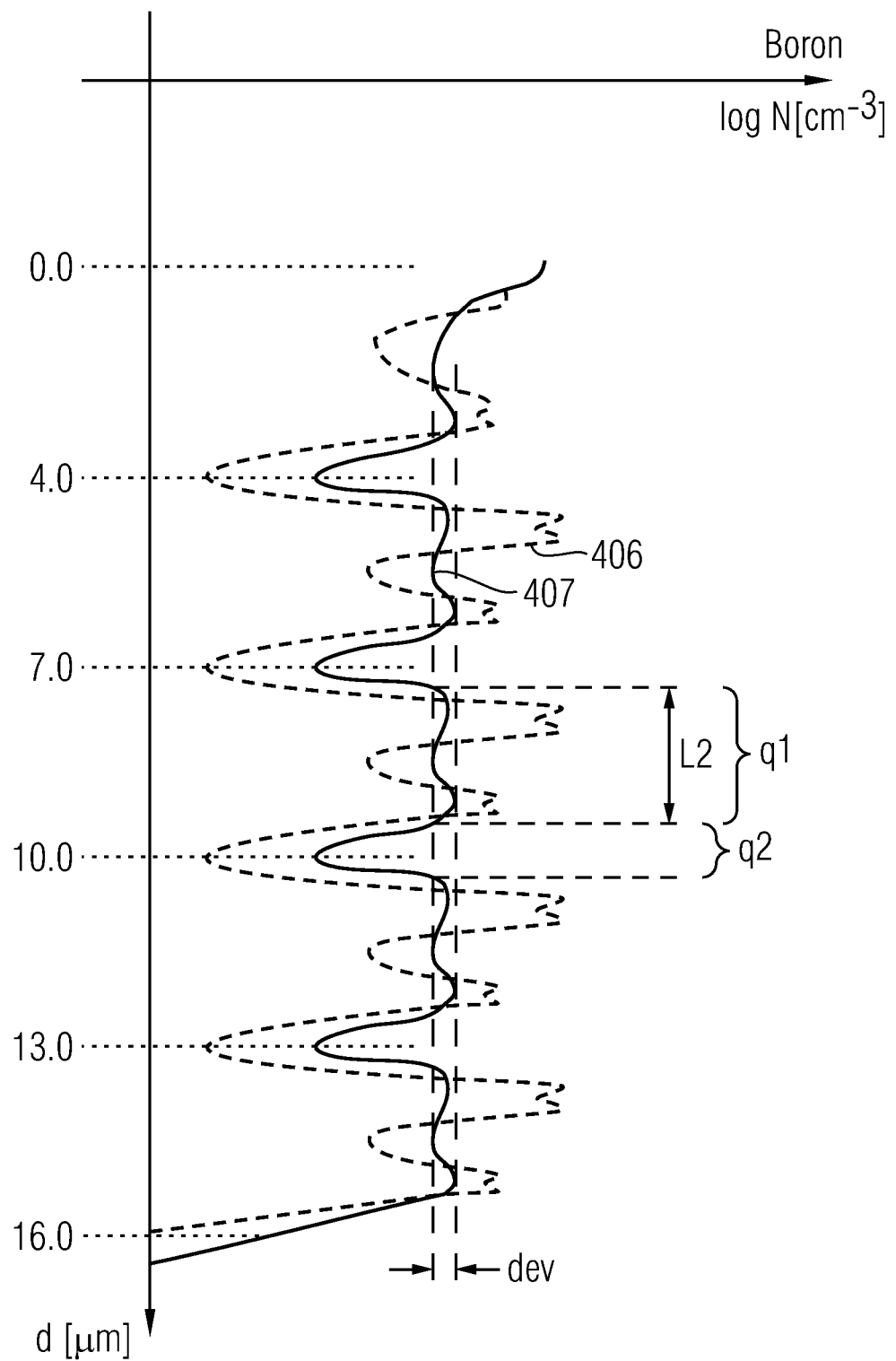
FIG. 4B is a simplified diagram showing a vertical boron dopant profile of the IGFET of FIG. 4A along line B-B.
Figure 4C:
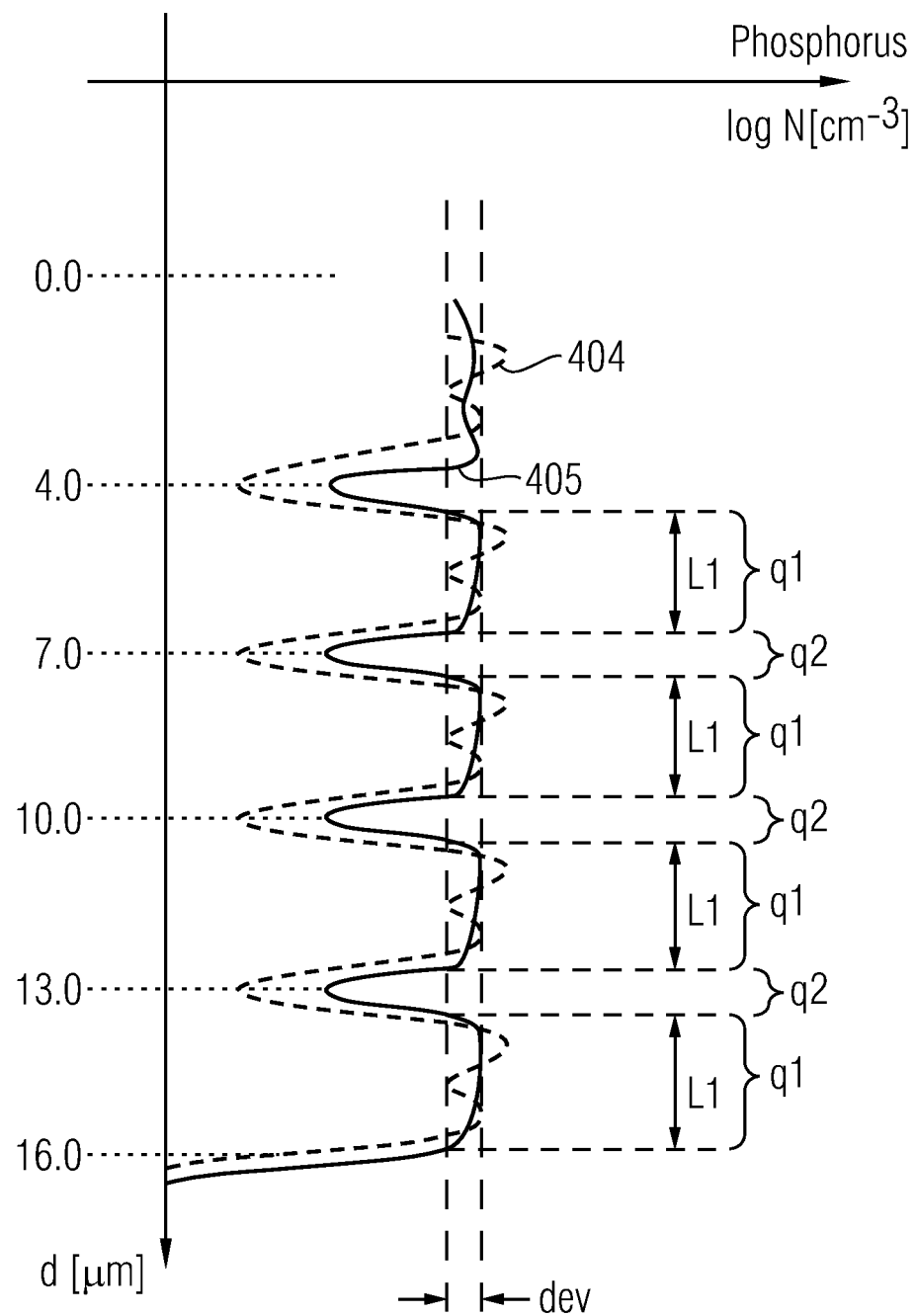
FIG. 4C is a simplified diagram showing a vertical phosphorus dopant profile of the IGFET of FIG. 4A along line C-C.

FIGS. 4B and 4C show vertical dopant profiles of the semiconductor device 500 of FIG. 4A along lines B-B and C-C at a logarithmic scale. According to an embodiment, for each impurity type the aligned low divergence ion implant process may include one single implant step at a given acceleration voltage or two or more implant steps at different acceleration voltages. According to the embodiments of FIG. 4A to 4C, one implant step is used for the phosphorus implant resulting in the doping profile 404 before tempering and the tempered dopant profile 405. For the boron implant two implant steps at different acceleration voltages are performed for each sub-layer resulting in the dopant profile 406 before tempering and in the dopant profile 407 after tempering. The two-step approach for boron allows adjusting the boron dopant profile more precisely to the phosphorus dopant profile such that a deviation (dev) for boron approximately matches a deviation dev for phosphorus for the same length of the first portions q1.

In more general, implanting impurities of the p-type may include at least two implant processes at different acceleration voltages and/or incidence angles per sub-layer. According to another embodiment, implanting impurities of the p-type may include at least one implant process, for example at least two or three, more per sub-layer than implanting impurities of the n-type.

The sequence of growing a sub-layer by epitaxy and implanting impurities of the first and second conductivity types in sections of the sub-layer in a projection of the first and second sections along the main crystal direction may be repeated a predefined number of times. The sub-layers 131 may be silicon or silicon carbide layers.

According to another embodiment, the boron implant provides one single step for generating defined local maxima of the electric field strength in order to improve the device response in the case of an avalanche breakdown. Other embodiments may provide two or more phosphorus implant steps for each sub-layer.

Accordingly, the super junction semiconductor device 500 of FIG. 4A includes n-type columns 136 with first portions q1 and p-type columns 135 with first portions q1, wherein the first portions q1 of the n-type columns 136 have a first mean length L1, the first portions q1 of the p-type columns have a second mean length L2 and the ratio L1:L2 is at least 2.

According to an embodiment providing more boron implants than phosphorus implants per sub-layer, the first portions q1 of the p-type columns 135 may have more local maximum values than the first portions q1 of the n-type columns 136.

Figure 5:
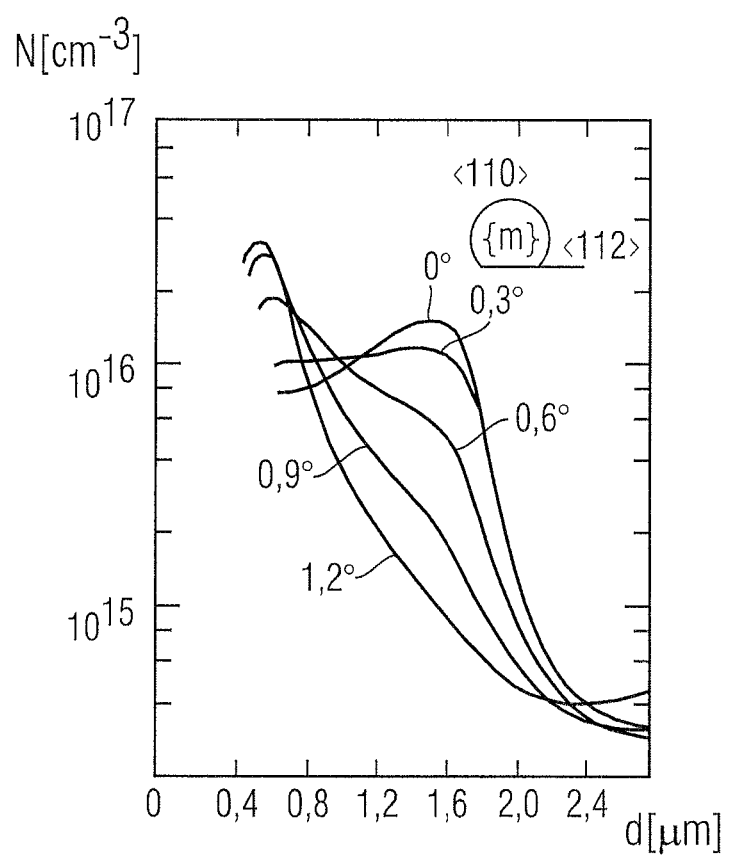
FIG. 5 is a diagram showing schematic dopant profiles as a function of an incident angle of the ion beam.

FIG. 5 shows dopant profiles for phosphorus implants at an implant energy of 450 keV as a function of an implant angle between the normal to a substrate surface and the impinging ion beam. At implant angles above ±0.3 degree a small change of the implant angle has significant impact on the dopant profile, whereas variations of the implant angle between 0 degree and ±0.3 degree result in deviations from a target dopant profile, which might be tolerable for some applications.

Figure 6A:
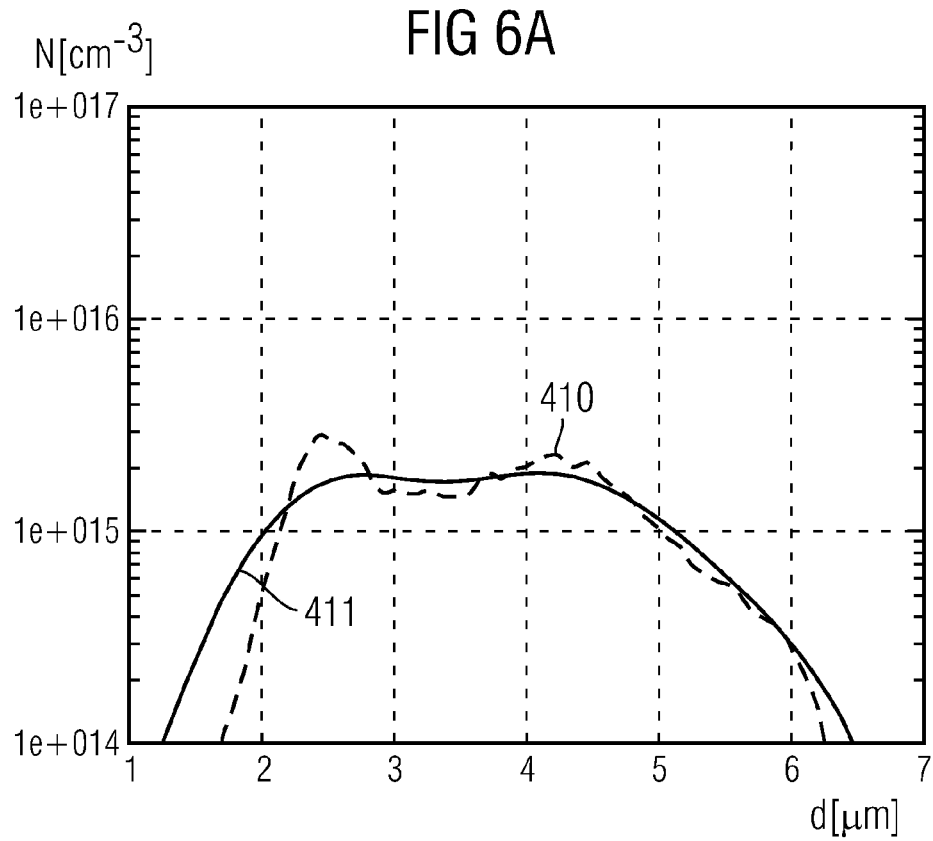
FIG. 6A is a diagram showing schematic vertical dopant profiles for phosphorus after implant at an implant angle of 0 degree and after tempering.

FIG. 6A shows vertical dopant profiles for phosphorus. The vertical implant dopant profile 410 results from implanting phosphorus with an acceleration energy of 3.5 MeV at an implant angle of 0 degree. The tempered dopant profile 411 results from tempering the implant dopant profile 410 at 1100 degree Celsius for two hours. The channeling effect results in a two-peak implant dopant profile and in plateaus representing vertically stretched sections of the dopant profile with dopant concentration variations of less than 30% of the maximum value in the tempered dopant profile 411. The plateau in the tempered dopant profile 411 extends from about 1.5 micrometer to beyond 2.5 micrometer, for example up to about 4.5 micrometer. Outside the plateau area the dopant concentration decreases at a higher rate than a Gaussian distribution having the same dopant concentration variation value within the same section would have.

Figure 6B:
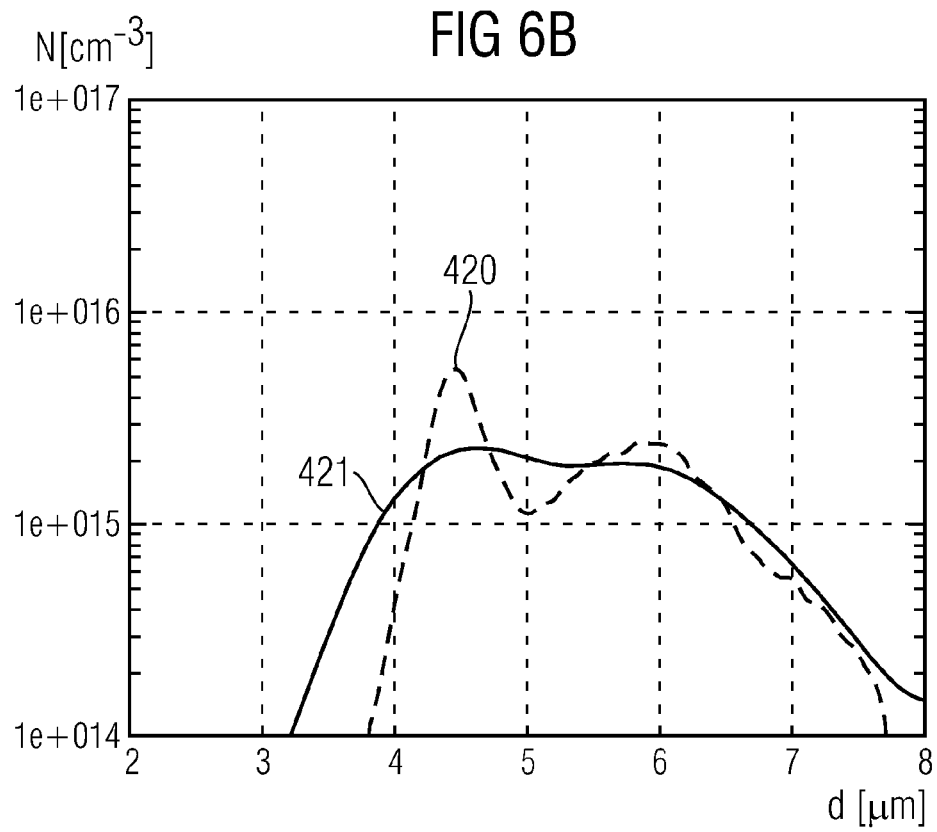
FIG. 6B is a schematic diagram showing schematic vertical dopant profiles for boron after implant at an implant angle of 0 degree and after tempering.

FIG. 6B shows vertical dopant profiles 420, 421 for a boron implant. The implant dopant profile 420 results from an implantation at 3.5 MeV and at an implant angle of 0 degree and shows again two peaks. The tempered dopant profile 421 is obtained by tempering the implant dopant profile 420 at 1100 degree Celsius for two hours. The tempered dopant profile 421 shows a plateau extending from about 3.8 micrometer to beyond 6.5 micrometer. Outside the plateau area the dopant concentration decreases at a higher rate than a Gaussian distribution having the same dopant concentration variation value within over the same length would have.

Figure 7A:
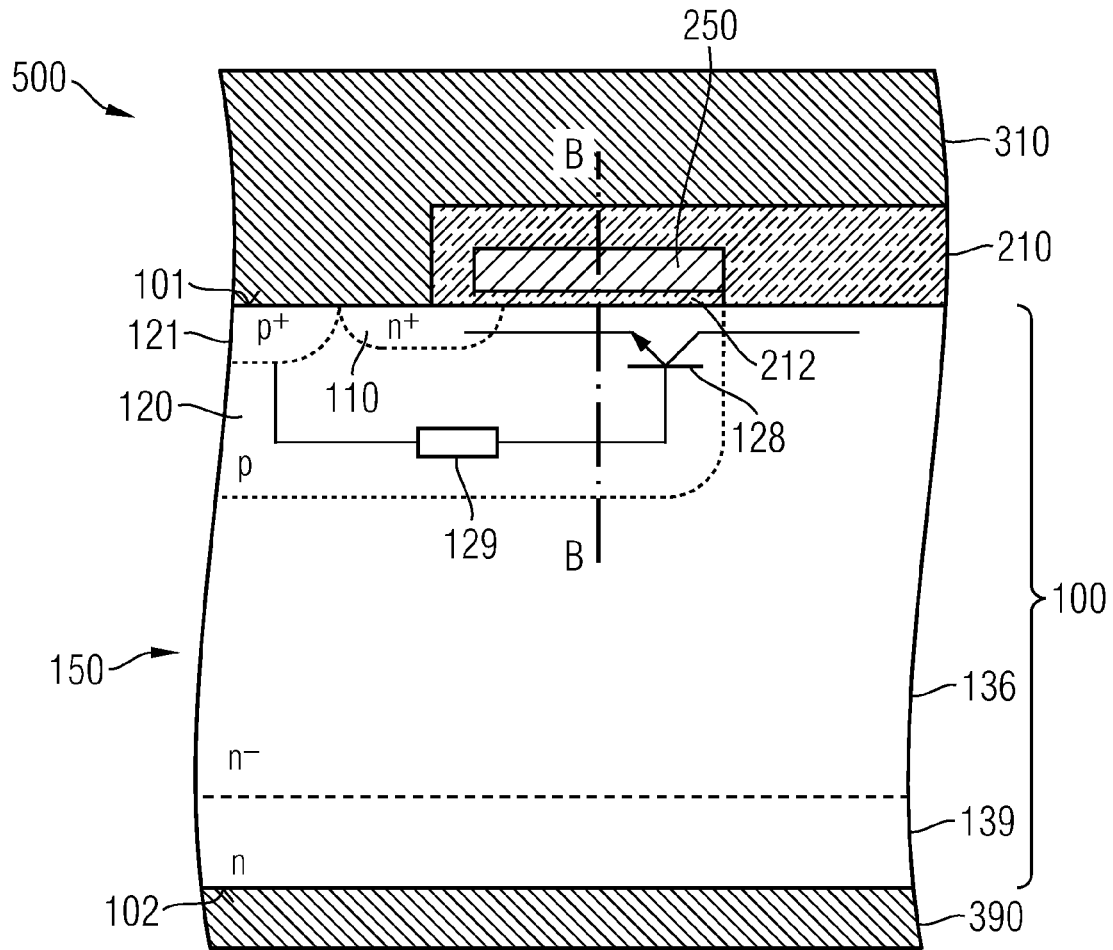
FIG. 7A is a schematic cross-sectional view of a switching semiconductor device including a body zone in accordance with a further embodiment.
Figure 7B:
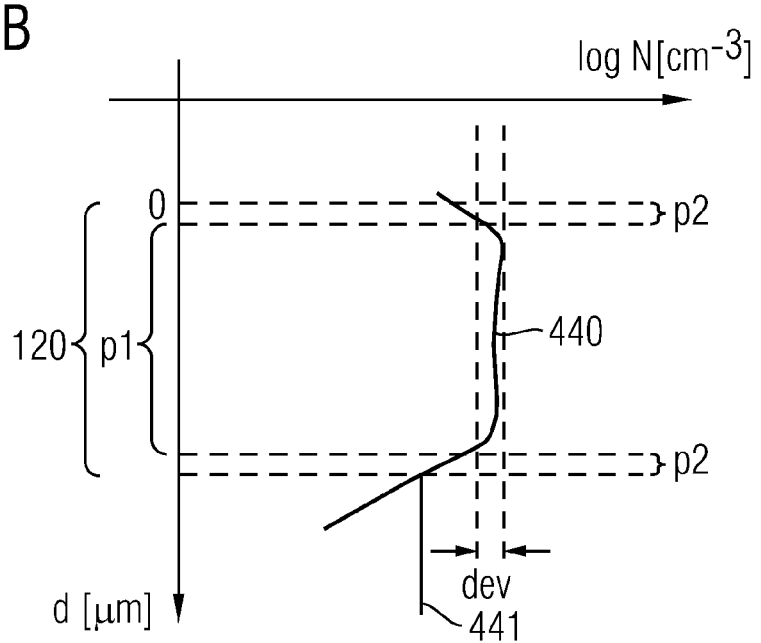
FIG. 7B is a diagram showing a schematic dopant profile of a body zone of the semiconductor device of FIG. 7A along line B-B.

FIGS. 7A and 7B refer to a further semiconductor device 500 which is an IGFET. A semiconductor die 100 includes an epitaxial layer 150 formed on a substrate layer 139. The substrate layer 139 may have a first conductivity type. In the epitaxial layer 150, body zones 120 of a second conductivity type are formed as implant wells. Portions of the epitaxial layer outside the body zones 120 form a drift zone 136 of the first conductivity type. Source zones 110 of the first conductivity type are formed as implant wells within the implant well of the body zone 120. The source zones 110 and highly doped body contact zones 121 of the second conductivity type directly adjoin the first surface 101 of the semiconductor die 100. A first metal layer 310 is provided at a distance to the first surface 101 and contact structures 320 extend between the metal layer 310 and the first surface 101. The contact structures 320 electrically connect the first metal layer 310 with the body contact zones 121 and the source zones 110. A gate dielectric 212 separates the body zone 120 and a gate electrode 250.

According to the illustrated embodiment the gate electrode 250 is provided at a distance to the semiconductor die 100. According to other embodiments the gate electrode 250 and the gate dielectric 212 may be formed in a trench extending from the first surface 101 into the semiconductor die 100. A dielectric structure 210 electrically insulates the first metal layer 310 from the gate electrode 250 and the drift zone 136.

A second metal layer 390 is formed on a second surface 102 of the semiconductor die 100 opposing the first surface 101. As regards further details and materials, reference is made to the description of FIG. 2A. Further embodiments may refer to an IGBT with a substrate layer 139 of the second conductivity type.

Outside the body contact zones 121, the body zones 120 have a vertical doping profile 440 perpendicular to the first surface 101 which includes a first portion p1 and two second portions p2 adjoining to both sides of the first portion p1. In the first portion p1 a dopant concentration varies by at most 30% of a maximum value within the first portion p1. The second portion p2 that adjoins to the drift zone 136 ends where the dopant concentration 441 of the drift zone 136 exceeds and compensates for the dopant concentration of the body zone 120. In the second portions p2 the dopant concentration is lower or higher than in the first portion p1. The ratio of the length of the first portion p1 to the total length of the first and second portions p1, p2 is at least 50%. According to an embodiment the deviation within the body zone 120 is at most 15% for more than 50% of the vertical extension of the body zone 120, for example for at least 65% or at least 80% of the vertical extension of the body zone 120.

The source zone 110, the body zone 120 and the drift zone 132 form a parasitic npn bipolar transistor 128. During operation of the semiconductor device 500, charge carriers may accumulate within the body zone 120. The strongly doped body contact zone 121 drains off the accumulating charge carriers from the body zone 120. For charge carriers drained off from areas of the body zone 120 close to the pn-junction to the drain zone 132 a parasitic resistance 129 is effective in the path to the highly doped body contact zone 121. A voltage drop occurs within the body zone 120 and may result in a base potential of the parasitic npn bipolar transistor 128 above the threshold voltage at which the parasitic npn transistor 128 switches on provoking a latch-up condition of the semiconductor device 500.

Compared to conventional devices, the highly uniform vertical and lateral dopant profiles of the body zone 120 reduce significantly the parasitic resistance 129. The occurrence of latch-up effects is shifted to higher currents.

According to an embodiment, the semiconductor device 500 is based on SiC. The temperature budget for diffusion processes, which is high in SiC, can be significantly reduced.

Figure 8:
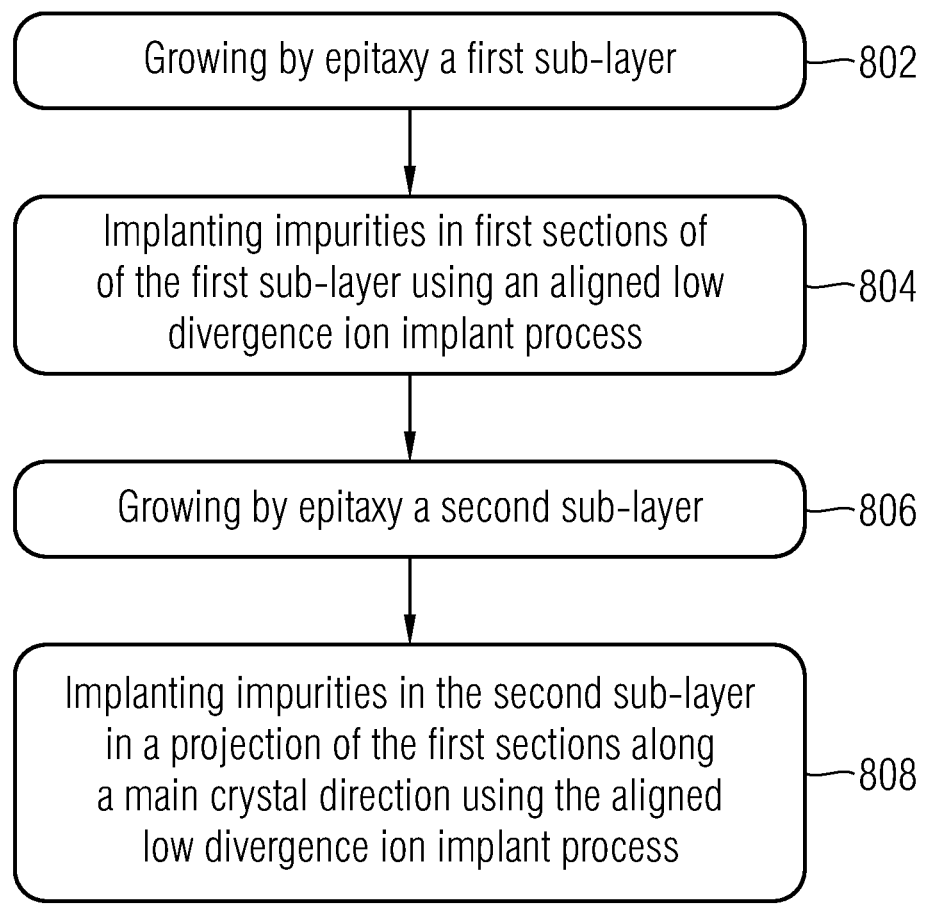
FIG. 8 is a simplified flow chart of a method of manufacturing a semiconductor device in accordance with a further embodiment.

FIG. 8 refers to a method of manufacturing a super-junction semiconductor device. A first sub-layer is grown by epitaxy on a substrate layer (802). Impurities of a first conductivity type are implanted into first sections of an exposed first surface of the first sub-layer using an aligned low divergence ion implant process (804). With the aligned low divergence ion implant process a main beam direction deviates from a main crystal direction, along which channeling of implant ions occurs, by at most ±1 degree, e.g. at most ±0.8 degree, ±0.5 degree, ±0.3 degree or ±0.15 degree. The smaller the deviation the more pronounced is the channeling effect. According to an embodiment, the deviation between the main crystal direction selected for channeling and the main beam direction is 0 degree.

A main beam incidence angle divergence is at most ±0.5 degree, for example at most ±0.3 degree. According to an embodiment, the main beam incidence angle divergence is at most ±0.15 degree. A second sub-layer is grown on the first sub-layer by epitaxy (806). Impurities of the first conductivity type are implanted in sections of an exposed first surface of the second sub-layer in a projection of the first sections along the main crystal direction using the aligned low divergence ion implant process (808).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a super-junction semiconductor device, the method comprising:
    growing by epitaxy a first sub-layer on a substrate layer;
    implanting impurities of a first conductivity type in first sections of a first surface of the first sub-layer using an aligned low divergence ion implant process, wherein a main beam direction deviates from a main crystal direction, along which channeling of implant ions occurs, by at most 1 degree and a main beam incidence angle divergence is at most ±0.5 degree;
    growing by epitaxy a second sub-layer on the first sub-layer; and
    implanting impurities of the first conductivity type in sections of a first surface of the second sub-layer in a projection of the first sections along the main crystal direction using the aligned low divergence ion implant process;
    wherein a tilt of at most 1 degree between the main beam direction and the main crystal direction, along which channeling of implant ions occurs, and the main beam incidence angle divergence of at most ±0.5 degree are achieved for at least 80% of an area of a wafer including the substrate layer.

2. The method of claim 1, comprising
controlling and re-adjusting, during implanting impurities, an angle between the first surface and the main beam direction such that the main beam direction coincides with the main crystal direction at a main beam incidence angle divergence of at most ±0.3 degrees.

3. The method of claim 1, wherein
the sub-layers have a diamond cubic crystal lattice, the exposed first surfaces of the sub-layers coincides with a {100} crystal face and the main crystal direction is the <110> direction.

4. The method of claim 1, further comprising
repeating, a predefined number of times, a sequence comprising growing a sub-layer by epitaxy and implanting impurities of the first conductivity type in sections of the sub-layer in a projection of the first sections along the main crystal direction.

5. The method of claim 1, wherein
implanting impurities of the first conductivity type includes two or more implant processes at different acceleration voltages.

6. The method of claim 1, wherein
the sub-layers are grown as in-situ doped p-type layers and the first conductivity type is the n type.

7. The method of claim 1, wherein
the sub-layers are grown as intrinsic sub-layers.

8. The method of claim 7, further comprising:
implanting impurities of a second conductivity type in second sections of the first surface of the first sub-layer using the aligned low divergence ion implant process before growing the second sub-layer; and
implanting impurities of the second conductivity type in sections of the first surface of the second sub-layer in a vertical projection of the second sections using the aligned low divergence ion implant process.

9. The method of claim 8, wherein
the first conductivity type is n-type, the second conductivity type is p-type, the impurities of the first conductivity type are phosphorus atoms and the impurities of the second conductivity type are boron atoms.

10. The method of claim 9, wherein
implanting impurities of the p-type includes at least two implant processes at different acceleration voltages and/or incidence angles per sub-layer.

11. The method of claim 9, wherein
per each sub-layer implanting impurities of the p-type includes at least one implant process more than implanting impurities of the n-type.

12. The method of claim 9, wherein
a sequence comprising growing a sub-layer by epitaxy and implanting impurities of the first and second conductivity types in sections of the sub-layer in a projection of the first and second sections along the main crystal direction is repeated at least two times.

13. The method of claim 1, wherein
the substrate layer is a silicon or silicon carbide substrate.

14. A method of manufacturing a super-junction semiconductor device, the method comprising:
    growing by epitaxy a first sub-layer on a substrate layer;
    implanting impurities of a first conductivity type in first sections of a first surface of the first sub-layer using an aligned low divergence ion implant process, wherein a main beam direction deviates from a main crystal direction, along which channeling of implant ions occurs, by at most 1 degree and a main beam incidence angle divergence is at most ±0.5 degree;
    growing by epitaxy a second sub-layer on the first sub-layer; and
    implanting impurities of the first conductivity type in sections of a first surface of the second sub-layer in a projection of the first sections along the main crystal direction using the aligned low divergence ion implant process;

wherein implanting impurities of the first conductivity type includes two or more implant processes at different acceleration voltages.

15. A method of manufacturing a super-junction semiconductor device, the method comprising:

growing by epitaxy a first sub-layer on a substrate layer;

implanting impurities of a first conductivity type in first sections of a first surface of the first sub-layer using an aligned low divergence ion implant process, wherein a main beam direction deviates from a main crystal direction, along which channeling of implant ions occurs, by at most 1 degree and a main beam incidence angle divergence is at most ±0.5 degree;

growing by epitaxy a second sub-layer on the first sub-layer; and implanting impurities of the first conductivity type in sections of a first surface of the second sub-layer in a projection of the first sections along the main crystal direction using the aligned low divergence ion implant process;

wherein the sub-layers are grown as in-situ doped p-type layers and the first conductivity type is the n type.

\* \* \* \* \*